(12) United States Patent
Konno

(10) Patent No.: US 7,731,868 B2
(45) Date of Patent: Jun. 8, 2010

(54) THICK FILM CONDUCTIVE COMPOSITION AND PROCESS FOR USE IN THE MANUFACTURE OF SEMICONDUCTOR DEVICE

(75) Inventor: Takuya Konno, Tochigi-Ken (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/786,717

(22) Filed: Apr. 12, 2007

(65) Prior Publication Data

US 2008/0254567 A1 Oct. 16, 2008

(51) Int. Cl.
*H01B 1/22* (2006.01)
*B05D 5/12* (2006.01)

(52) U.S. Cl. ............ 252/514; 427/96.1; 136/256

(58) Field of Classification Search ............ 252/514, 252/519.5; 106/1.14; 427/96.1; 136/256
See application file for complete search history.

(56) References Cited

U.S. PATENT DOCUMENTS

| | | | |
|---|---|---|---|
| 4,256,513 A | 3/1981 | Yoshida et al. | |
| 4,737,197 A | 4/1988 | Nagahara et al. | |
| 5,623,389 A * | 4/1997 | Sanada | 361/321.1 |
| 5,645,765 A * | 7/1997 | Asada et al. | 252/519.51 |
| 2002/0005507 A1 | 1/2002 | Matsumoto | |
| 2004/0214016 A1 | 10/2004 | Adachi | |
| 2006/0231801 A1* | 10/2006 | Carroll et al. | 252/500 |
| 2006/0289055 A1 | 12/2006 | Sridharan et al. | |

FOREIGN PATENT DOCUMENTS

| | | |
|---|---|---|
| EP | 1 717 858 A1 | 11/2006 |
| JP | 2001-313400 | * 11/2001 |

OTHER PUBLICATIONS

PCT International Search Report and Written Opinion for International Application No. PCT/US2008/004657 dated Jul. 15, 2008.

* cited by examiner

*Primary Examiner*—Mark Kopec

(57) ABSTRACT

The present invention is directed to a thick film conductive composition comprising: a) electrically conductive silver powder; b) ZnO powder; c) lead-free glass frits wherein based on total glass frits: $Bi_2O_3$: >5 mol %, $B_2O_3$: <15 mol %, BaO: <5 mol %, SrO: <5 mol %, $Al_2O_3$: <5 mol %; and d) organic medium, wherein (the content of ZnO/the content of the silver powder)×100 is more than 2.5.

13 Claims, 4 Drawing Sheets

THICK FILM CONDUCTIVE COMPOSITION AND PROCESS FOR USE IN THE MANUFACTURE OF SEMICONDUCTOR DEVICE

FIELD OF THE INVENTION

This invention is directed primarily to a silicon semiconductor device. In particular, it is directed to a conductive silver paste for use in the front side of a solar cell device.

TECHNICAL BACKGROUND OF THE INVENTION

The present invention can be applied to a broad range of semiconductor devices, although it is especially effective in light-receiving elements such as photodiodes and solar cells. The background of the invention is described below with reference to solar cells as a specific example of the prior art.

A conventional solar cell structure with a p-type base has a negative electrode that is typically on the front-side or sun side of the cell and a positive electrode on the backside. It is well-known that radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metallized, i.e., provided with metal contacts that are electrically conductive.

Most terrestrial electric power-generating solar cells currently are silicon solar cells. Process flow in mass production is generally aimed at achieving maximum simplification and minimizing manufacturing costs. Electrodes in particular are made by using a method such as screen printing to form a metal paste. An example of this method of production is described below in conjunction with FIG. 1.

FIG. 1A shows a p-type silicon substrate, 10.

In FIG. 1B, an n-type diffusion layer, 20, of the reverse conductivity type is formed by the thermal diffusion of phosphorus (P) or the like. Phosphorus oxychloride ($POCl_3$) is commonly used as the phosphorus diffusion source. In the absence of any particular modification, the diffusion layer, 20, is formed over the entire surface of the silicon substrate, 10. This diffusion layer typically has a sheet resistivity on the order of several tens of ohms per square ($\Omega/\square$), and a thickness of about 0.3 to 0.5 μm.

After protecting one surface of this diffusion layer with a resist or the like, as shown in FIG. 1C, the diffusion layer, 20, is removed from most surfaces by etching so that it remains only on one main surface. The resist is then removed using an organic solvent or the like.

Next, a silicon nitride film, 30, is formed as an anti-reflection coating on the n-type diffusion layer, 20, to a thickness of typically about 700 to 900 Å in the manner shown in FIG. 1D by a process such as plasma chemical vapor deposition (CVD).

As shown in FIG. 1E, a silver paste, 500, for the front electrode is screen printed then dried over the silicon nitride film, 30. In addition, a backside silver or silver/aluminum paste, 70, and an aluminum paste, 60, are then screen printed and successively dried on the backside of the substrate. Firing is then carried out in an infrared furnace at a temperature range of approximately 700° C. to 975° C. for a period of from several minutes to several tens of minutes.

Consequently, as shown in FIG. 1F, aluminum diffuses from the aluminum paste into the silicon substrate, 10, as a dopant during firing, forming a p+ layer, 40, containing a high concentration of aluminum dopant. This layer is generally called the back surface field (BSF) layer, and helps to improve the energy conversion efficiency of the solar cell.

The aluminum paste is transformed by firing from a dried state, 60, to an aluminum back electrode, 61. The backside silver or silver/aluminum paste, 70, is fired at the same time, becoming a silver or silver/aluminum back electrode, 71. During firing, the boundary between the back side aluminum and the back side silver or silver/aluminum assumes an alloy state, and is connected electrically as well. The aluminum electrode accounts for most areas of the back electrode, owing in part to the need to form a p+ layer, 40. Because soldering to an aluminum electrode is impossible, a silver back electrode is formed over portions of the back side as an electrode for interconnecting solar cells by means of copper ribbon or the like. In addition, the front electrode-forming silver paste, 500, sinters and penetrates through the silicon nitride film, 30, during firing, and is thereby able to electrically contact the n-type layer, 20. This type of process is generally called "fire through." This fired through state is apparent in layer 501 of FIG. 1F.

JP-2001-313400A to Fujii et al. teaches a solar cell which is obtained by forming, on one main surface of a semiconductor substrate, regions that exhibit the other type of conductivity and forming an antireflection coating on this main surface of the semiconductor substrate. The resulting solar cell has an electrode material coated over the antireflection coating and fired. The electrode material includes, for example, lead, boron and silicon, and additionally contains, in a glass frit having a softening point of about 300 to 600° C., and one or more powders from among titanium, bismuth, cobalt, zinc, zirconium, iron, and chromium.

U.S. Pat. No. 4,737,197 to Nagahara et al. discloses a solar cell including a semiconductor substrate, a diffused layer provided in the semiconductor substrate by diffusion of dopant impurities, and a contact made of metal paste formed on the diffusion layer. The metal paste includes metal powder, which functions as the main contact material, glass frits, an organic binder, a solvent, and an element belonging to the fifth group of the periodic table.

U.S. Patent Publication 2006-0231801 A1 to Alan et al. teaches a thick film conductive composition comprising: (a) electrically conductive silver powder; (b) zinc-containing additive; (c) glass frit wherein said glass frit is lead-free; dispersed in (d) organic medium. As a preferred glass, the following composition is referred to: $SiO_2$ 0.1-8 wt %, $Al_2O_3$ 0-4 wt %, $B_2O_3$ 8-25 wt %, CaO 0-1 wt %, ZnO 0-42 wt %, $Na_2O$ 0-4 wt %, $Li_2O$ 0-3.5 wt %, $Bi_2O_3$ 28-85 wt %, $Ag_2O$ 0-3 wt %, $CeO_2$ 0-4.5 wt %, $SnO_2$ 0-3.5 wt %, and $BiF_3$ 0-15 wt %.

U.S. Patent Publication 2006-0289055 to Sridharan et al. teaches a solar cell comprising a contact made from a mixture wherein, prior to firing, the mixture comprises: solids portion and organics portion, wherein the solids portion comprises (i) from about 85 to about 99 wt % of a conductive metal component, and (ii) from about 1 to about 15 wt % of a glass component, wherein the glass component is lead-free.

Although, as noted, various methods and compositions for forming solar cells exist, there is an on-going effort to provide compositions which are Pb-free while at the same time maintaining electrical performance. The present inventors create a novel composition and method of manufacturing a semiconductor device which provides such a Pb-free system and maintains electrical performance and solder adhesion.

SUMMARY OF THE INVENTION

The present invention is directed to a thick film conductive composition comprising: a) electrically conductive silver powder; b) ZnO powder; c) lead-free glass frits wherein based on total glass frits: $Bi_2O_3$: >5 mol %, $B_2O_3$: <15 mol %, BaO: <5 mol %, SrO: <5 mol %, $Al_2O_3$: <5 mol %; and d) organic medium, wherein (the content of ZnO/the content of the silver powder)×100 is more than 2.5.

The present invention is further directed to an electrode formed from the composition above wherein said composition has been fired to remove the organic medium and to sinter said glass particles. Still further, the invention is directed to a method of manufacturing a semiconductor device from a structural element composed of a semiconductor having a p-n junction and an insulating film formed on a main surface of the semiconductor comprising the steps of (a) applying onto said insulating film the thick film composition detailed above; and (b) firing said semiconductor, insulating film and thick film composition to form an electrode. Additionally, the present invention is directed to a semiconductor device formed by the method detailed above and a semiconductor device formed from the thick film conductive composition detailed above.

DETAILED DESCRIPTION OF THE INVENTION

Figure 1A:
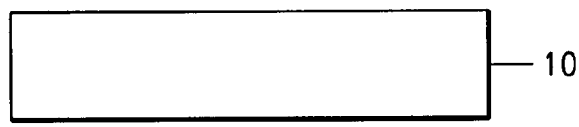
FIG. 1 is a process flow diagram illustrating the fabrication of a semiconductor device.

The main components of the thick film conductor composition(s) are electrically functional silver powders, ZnO powder, and Pb-free glass frit dispersed in an organic medium. The glass frit of the present invention has prescribed content of $Bi_2O_3$, $B_2O_3$, BaO, SrO, and $Al_2O_3$. Further, the composition of the present invention meets a specific relationship between ZnO and Ag. Additional additives may include metals, metal oxides or any compounds that can generate these metal oxides during firing. The components are discussed herein below.

Inorganic Components

The inorganic components of the present invention comprise (1) electrically functional silver powders; (2) zinc oxide (ZnO); and (3) Pb-free glass frit; and optionally (4) additional metal/metal oxide additive selected from (a) a metal selected from Zn, Gd, Ce, Zr, Ti, Mn, Sn, Ru, Co, Fe, Cu and Cr; (b) an oxide of a metal selected from Zn, Gd, Ce, Zr, Ti, Mn, Sn, Ru, Co, Fe, Cu and Cr; (c) any compounds that can generate the metal oxides of (b) upon firing; and (d) mixtures thereof.

A. Electrically Functional Silver Powders

Generally, a thick film composition comprises a functional phase that imparts appropriate electrically functional properties to the composition. The functional phase comprises electrically functional powders dispersed in an organic medium that acts as a carrier for the functional phase that forms the composition. The composition is fired to burn out the organic phase, activate the inorganic binder phase and to impart the electrically functional properties.

The functional phase of the composition may be coated or uncoated silver particles which are electrically conductive. When the silver particles are coated, they may be partially coated with a surfactant. The surfactant may be selected from, but is not limited to, stearic acid, palmitic acid, a salt of stearate, a salt of palmitate and mixtures thereof. Other surfactants may be utilized including lauric acid, palmitic acid, oleic acid, stearic acid, capric acid, myristic acid and linolic acid. The counter-ion can be, but is not limited to, hydrogen, ammonium, sodium, potassium and mixtures thereof.

The particle size of the silver is not subject to any particular limitation, although an average particle size of no more than 10 μm, and preferably no more than 5 μm, is desirable. The silver powder accounts for, but not limited to, 70 to 85 wt % of the paste composition, and generally 85 to 99 wt % of the solids in the composition (i.e., excluding the organic vehicle).

B. Zinc Oxide (ZnO) Powder

In one embodiment, ZnO powder has an average particle size in the range of 10 nm to 10 μm. In a further embodiment, the ZnO powder has an average particle size of 40 nm to 5 μm. In still a further embodiment, the ZnO powder has an average particle size of 60 nm to 3 μm.

As shown in the following example section, it was found that higher ZnO in comparison to Ag upgrades electric performance of formed electrode. For example, the efficiency of solar is improved. In this context, the content of ZnO and the content of Ag meet the following formula.

(the content of ZnO/the content of the silver powder)× 100>2.5

The value of the formula is preferably more than 4.0, and more preferably more than 5.0.

Typically, ZnO is present in the composition in the range of 0.5 to 15.0 weight percent total composition. In one embodiment, the ZnO is present in the range of 2.0 to 7.0 weight percent total composition.

C. Glass Frit

As shown in the following example section, higher $Bi_2O_3$ content upgrades electric performance of formed electrode. For example, the contact resistance between solar cell and electrode is reduced, resulting in the superior performance of formed solar cell. To the contrary, higher $B_2O_3$, BaO, SrO, and $Al_2O_3$ content of the glass degrades performance. In this context, the glass frit of the present invention contains the following oxide constituents at the prescribed range.

$Bi_2O_3$: >5 mol %
$B_2O_3$: <15 mol %
BaO: <5 mol %
SrO: <5 mol %
$Al_2O_3$: <5 mol %.

$Bi_2O_3$ is contained preferably in the range of 10.0 to 60.0 mol %. The content of $B_2O_3$ is preferably less than 15.0 mol %, more preferably less than 10.0 mol %. The content of BaO is preferably less than 2.0 mol %, more preferably substantially 0 mol %. The content of SrO is preferably less than 2.0 mol %, more preferably 0 mol %. The content of $Al_2O_3$ is preferably less than 2.0 mol %, more preferably 0 mol %.

As examples of glass frit, glass frit that contains $Bi_2O_3$ as a main component may be used. In case that $Bi_2O_3$ is used as a main component of glass frit, the content of $Bi_2O_3$ is preferably 10.0-60.0 mol %. The content of $B_2O_3$ is preferably 0.0-15.0 mol %.

Substitutions of glass formers such as $P_2O_5$ 0-3, $GeO_2$ 0-3, $V_2O_5$ 0-3 in weight % may be used either individually or in combination to achieve similar performance. It is also possible to substitute one or more intermediate oxides, such as $TiO_2$, $Ta_2O_5$, $Nb_2O_5$, $ZrO_2$, $CeO_2$, $SnO_2$ for other intermediate oxides (i.e., $CeO_2$, $SnO_2$) present in a glass composition of this invention. The CaO, alkaline earth content, can also be partially or fully replaced by other alkaline earth constituents such as MgO although CaO maybe preferred.

An average particle size in the range of 1.0-4.0 µm is preferred. The softening point of the glass frit (Ts: second transition point of DTA) is preferred to be in the range of 450-650° C. The amount of glass frit in the total composition is preferably in the range of 0.5 to 7.0 wt. % of the total composition. In one embodiment, the glass composition is present in the amount of 0.5 to 4.0 weight percent total composition. In a further embodiment, the glass composition is present in the range of 1.0 to 3.0 weight percent total composition.

The glasses described herein are produced by conventional glass making techniques. The glasses can be prepared in 500-1000 gram quantities. Typically, the ingredients are weighed then mixed in the desired proportions and heated in a bottom-loading furnace to form a melt in platinum alloy crucibles. Heating is conducted to a peak temperature (1000° C.-1200° C.) and for a time such that the melt becomes entirely liquid and homogeneous. The molten glass is quenched between counter rotating stainless steel rollers to form a 10-20 mil thick platelet of glass. The resulting glass platelet is then milled to form a powder with its 50% volume distribution set between 1-3 µm.

D. Additional Metal/Metal Oxide Additives

The additional metal/metal oxide additives of the present invention may be selected from (a) a metal wherein said metal is selected from Gd, Ce, Zr, Ti, Mn, Sn, Ru, Co, Fe, Cu, and Cr; (b) a metal oxide of one or more of the metals selected from Gd, Ce, Zr, Ti, Mn, Sn, Ru, Co, Fe, Cu and Cr; (c) any compounds that can generate the metal oxides of (b) upon firing; and (d) mixtures thereof.

The particle size of the additional metal/metal oxide additives is not subject to any particular limitation, although an average particle size of no more than 10 µm, and preferably no more than 5 µm, is desirable.

In one embodiment, the particle size of the metal/metal oxide additive is in the range of 10 nanometers (nm) to 10 micrometer (µm).

Organic Components

E. Organic Medium

The inorganic components are typically mixed with an organic medium by mechanical mixing to form viscous compositions called "pastes", having suitable consistency and rheology for printing or coating. A wide variety of inert viscous materials can be used as organic medium. The organic medium must be one in which the inorganic components are dispersible with an adequate degree of stability. The rheological properties of the medium is preferred to be such that they lend good application properties to the composition, including: stable dispersion of solids, appropriate viscosity and thixotropy for screen printing, appropriate wettability of the substrate and the paste solids, a good drying rate, and good firing properties. The organic vehicle used in the thick film composition of the present invention is preferably a nonaqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 8 wt % to 11 wt % of the total composition. The thick film silver composition of the present invention may be adjusted to a predetermined, screen-printable viscosity with the organic medium.

The ratio of organic medium in the thick film composition to the inorganic components in the dispersion is dependent on the method of applying the paste and the kind of organic medium used, and it can vary. Usually, the dispersion will contain 70-95 wt % of inorganic components and 5-30 wt % of organic medium (vehicle) in order to obtain good wetting.

Description of Method of Manufacturing a Semiconductor Device

Accordingly, the invention provides a novel composition(s) that may be utilized in the manufacture of a semiconductor device. The semiconductor device may be manufactured by the following method from a structural element composed of a junction-bearing semiconductor substrate and a silicon nitride insulating film formed on a main surface thereof. The method of manufacture of a semiconductor device includes the steps of applying (typically, coating and printing) onto the insulating film, in a predetermined shape and at a predetermined position, the conductive thick film composition of the present invention having the ability to penetrate the insulating film, then firing so that the conductive thick film composition melts and passes through the insulating film, effecting electrical contact with the silicon substrate. The electrically conductive thick film composition is a thick-film paste composition, as described herein, which is made of a silver powder, ZnO powder, a glass or glass powder mixture having a softening point of 450 to 650° C., dispersed in an organic vehicle and optionally, additional metal/metal oxide additive(s).

The composition has a glass powder content of less than 7% by weight of the total composition and ZnO powder combined with optional additional metal/metal oxide additive content of no more than 15% by weight of the total composition. The invention also provides a semiconductor device manufactured from the same method.

The invention may also be characterized by the use of a silicon nitride film or silicon oxide film as the insulating film. The silicon nitride film is typically formed by a plasma chemical vapor deposition (CVD) or thermal CVD process. The silicon oxide film is typically formed by thermal oxidation, thermal CFD or plasma CFD.

The method of manufacture of the semiconductor device may also be characterized by manufacturing a semiconductor device from a structural element composed of a junction-bearing semiconductor substrate and an insulating film formed on one main surface thereof, wherein the insulating layer is selected from a titanium oxide silicon nitride, SiNx:H, silicon oxide, and silicon oxide/titanium oxide film, which method includes the steps of forming on the insulating film, in a predetermined shape and at a predetermined position, a metal paste material having the ability to react and penetrate the insulating film, forming electrical contact with the silicon substrate. The titanium oxide film is typically formed by coating a titanium-containing organic liquid material onto the semiconductor substrate and firing, or by a thermal CVD. The silicon nitride film is typically formed by PECVD (plasma enhanced chemical vapor deposition). The invention also provides a semiconductor device manufactured from this same method.

The electrode formed from the conductive thick film composition(s) of the present invention is typically fired in an atmosphere that is preferably composed of a mixed gas of oxygen and nitrogen. This firing process removes the organic medium and sinters the glass frit with the Ag powder in the conductive thick film composition. The semiconductor substrate is typically single-crystal or multicrystalline silicon.

FIG. 1A shows a step in which a substrate of single-crystal silicon or of multicrystalline silicon is provided typically, with a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 μm of the substrate surface using an aqueous alkali solution such as aqueous potassium hydroxide or aqueous sodium hydroxide, or using a mixture of hydrofluoric acid and nitric acid. In addition, a step in which the substrate is washed with a mixture of hydrochloric acid and hydrogen peroxide may be added to remove heavy metals such as iron adhering to the substrate surface. An antireflective textured surface is sometimes formed thereafter using, for example, an aqueous alkali solution such as aqueous potassium hydroxide or aqueous sodium hydroxide. This gives the substrate, 10.

Figure 1B:
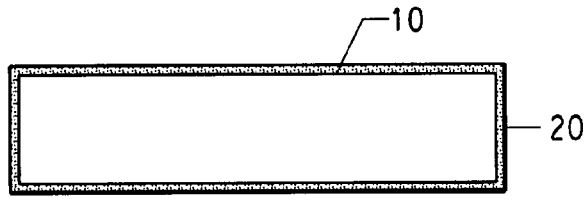
Figure 1C:

Next, referring to FIG. 1B, when the substrate used is a p-type substrate, an n-type layer is formed to create a p-n junction. The method used to form such an n-type layer may be phosphorus (P) diffusion using phosphorus oxychloride (POCl$_3$). The depth of the diffusion layer in this case can be varied by controlling the diffusion temperature and time, and is generally formed within a thickness range of about 0.3 to 0.5 μm. The n-type layer formed in this way is represented in the diagram by reference numeral 20. Next, p-n separation on the front and backsides may be carried out by the method described in the background of the invention. These steps are not always necessary when a phosphorus-containing liquid coating material such as phosphosilicate glass (PSG) is applied onto only one surface of the substrate by a process, such as spin coating, and diffusion is effected by annealing under suitable conditions. Of course, where there is a risk of an n-type layer forming on the backside of the substrate as well, the degree of completeness can be increased by employing the steps detailed in the background of the invention.

Figure 1D:
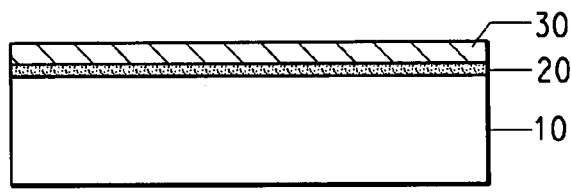

Next, in FIG. 1D, a silicon nitride film or other insulating films including SiNx:H (i.e., the insulating film comprises hydrogen for passivation during subsequent firing processing) film, titanium oxide film, and silicon oxide film, 30, which functions as an antireflection coating is formed on the above-described n-type diffusion layer, 20. This silicon nitride film, 30, lowers the surface reflectance of the solar cell to incident light, making it possible to greatly increase the electrical current generated. The thickness of the silicon nitride film, 30, depends on its refractive index, although a thickness of about 700 to 900 Å is suitable for a refractive index of about 1.9 to 2.0. This silicon nitride film may be formed by a process such as low-pressure CVD, plasma CVD, or thermal CVD. When thermal CVD is used, the starting materials are often dichlorosilane (SiCl$_2$H$_2$) and ammonia (NH$_3$) gas, and film formation is carried out at a temperature of at least 700° C. When thermal CVD is used, pyrolysis of the starting gases at the high temperature results in the presence of substantially no hydrogen in the silicon nitride film, giving a compositional ratio between the silicon and the nitrogen of Si$_3$N$_4$ which is substantially stoichiometric. The refractive index falls within a range of substantially 1.96 to 1.98. Hence, this type of silicon nitride film is a very dense film whose characteristics, such as thickness and refractive index, remain unchanged even when subjected to heat treatment in a later step. The starting gas used when film formation is carried out by plasma CVD is generally a gas mixture of SiH$_4$ and NH$_3$. The starting gas is decomposed by the plasma, and film formation is carried out at a temperature of 300 to 550° C. Because film formation by such a plasma CVD process is carried out at a lower temperature than thermal CVD, the hydrogen in the starting gas is present as well in the resulting silicon nitride film. Also, because gas decomposition is effected by a plasma, another distinctive feature of this process is the ability to greatly vary the compositional ratio between the silicon and nitrogen. Specifically, by varying such conditions as the flow rate ratio of the starting gases and the pressure and temperature during film formation, silicon nitride films can be formed at varying compositional ratios between silicon, nitrogen and hydrogen, and within a refractive index range of 1.8 to 2.5. When a film having such properties is heat-treated in a subsequent step, the refractive index may change before and after film formation due to such effects as hydrogen elimination in the electrode firing step. In such cases, the silicon nitride film required in a solar cell can be obtained by selecting the film-forming conditions after first taking into account the changes in film qualities that will occur as a result of heat treatment in the subsequent step.

In FIG. 1D, a titanium oxide film may be formed on the n-type diffusion layer, 20, instead of the silicon nitride film, 30, functioning as an antireflection coating. The titanium oxide film is formed by coating a titanium-containing organic liquid material onto the n-type diffusion layer, 20, and firing, or by thermal CVD. It is also possible, in FIG. 1D, to form a silicon oxide film on the n-type diffusion layer, 20, instead of the silicon nitride film 30 functioning as an antireflection layer. The silicon oxide film is formed by thermal oxidation, thermal CVD or plasma CVD.

Figure 1E:
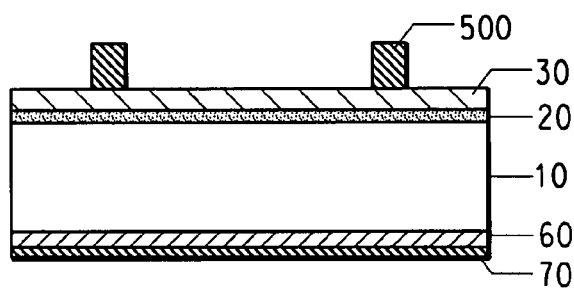
Figure 1F:
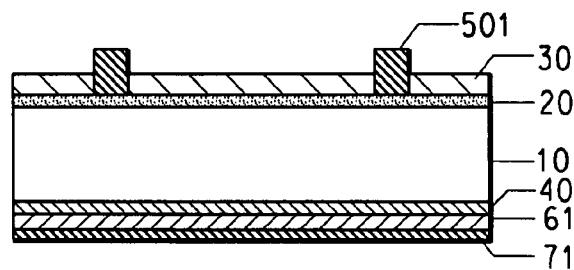

Next, electrodes are formed by steps similar to those shown in FIG. 1E and FIG. 1F. That is, as shown in FIG. 1E, aluminum paste, 60, and back side silver paste, 70, are screen printed onto the back side of the substrate, 10, as shown in FIG. 1E and successively dried. In addition, a front electrode-forming silver paste is screen printed onto the silicon nitride film, 30, in the same way as on the back side of the substrate, 10, following which drying and firing are carried out in an infrared furnace at typically at a set point temperature range of 700 to 975° C. for a period of from one minute to more than ten minutes while passing through the furnace a mixed gas stream of oxygen and nitrogen.

As shown in FIG. 1F, during firing, aluminum diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a p+ layer, 40. At the same time, because soldering to an aluminum electrode is impossible, the silver or silver/aluminum back electrode is formed on limited areas of the backside as an electrode for interconnecting solar cells by means of copper ribbon or the like.

On the front side, the front electrode silver paste, 500, of the invention is composed of silver, ZnO, glass frit, organic medium and optional metal oxides, and is capable of reacting and penetrating through the silicon nitride film, 30, during firing to achieve electrical contact with the n-type layer, 20 (fire through). This fired-through state, i.e., the extent to which the front electrode silver paste melts and passes through the silicon nitride film, 30, depends on the quality and thickness of the silicon nitride film, 30, the composition of the front electrode silver paste, and on the firing conditions. The conversion efficiency and moisture resistance reliability of the solar cell clearly depend, to a large degree, on this fired-through state.

EXAMPLES

The thick film composition(s) of the present invention are described herein below.

(I) Survey on Component Contained in Glass Frit
  (A) Paste Preparation
  Used material in the paste preparation and the content of each component are as follows.
  i) Electrically Functional Silver Powders: spherical silver particle [$d_{50}$ 2.5 μm (as determined with a laser scattering-type particle size distribution measuring apparatus). The content of Ag powder was 81.0 parts by weight.
  ii) Zinc oxide (ZnO) powder: irregular shaped. The content of ZnO powder was 4.4 parts by weight.
  iii) Glass Frit: various glass frit as shown in table 1-5 were prepared to survey the effect of each oxide contained in the glass frit. The content of glass frit was 2.4 parts by weight.
  iv) Organic Medium: Ethyl cellulose resin (Aqualon, Hercules) and Terpineol. The content of organic medium was 9.6 parts by weight.

Paste preparations were, in general, accomplished with the following procedure: The appropriate amount of solvent, medium and surfactant was weighed then mixed in a mixing can for 15 minutes, then glass frits and metal additives were added and mixed for another 15 minutes. Since Ag is the major part of the solids of the present invention, it was added incrementally to ensure better wetting. When well mixed, the paste was repeatedly passed through a 3-roll mill for at progressively increasing pressures from 0 to 400 psi. The gap of the rolls was adjusted to 1 mil. The degree of dispersion was measured by fineness of grind (FOG). A typical FOG value is generally equal to or less than 20/10 for conductors.
  (B) Test Procedure-Contact Resistance (Rc)
  Contact Resistance (Rc) was calculated by TLM method. The shape of electrode for TLM measurement was 10 mm width and 1 mm length. The distance between electrode was 1 mm, 2 mm, 3 mm, 4 mm, and 5 mm.
  Firing Conditions: The wafers were fired under the following conditions using an IR heating belt furnace.

Figure 2:
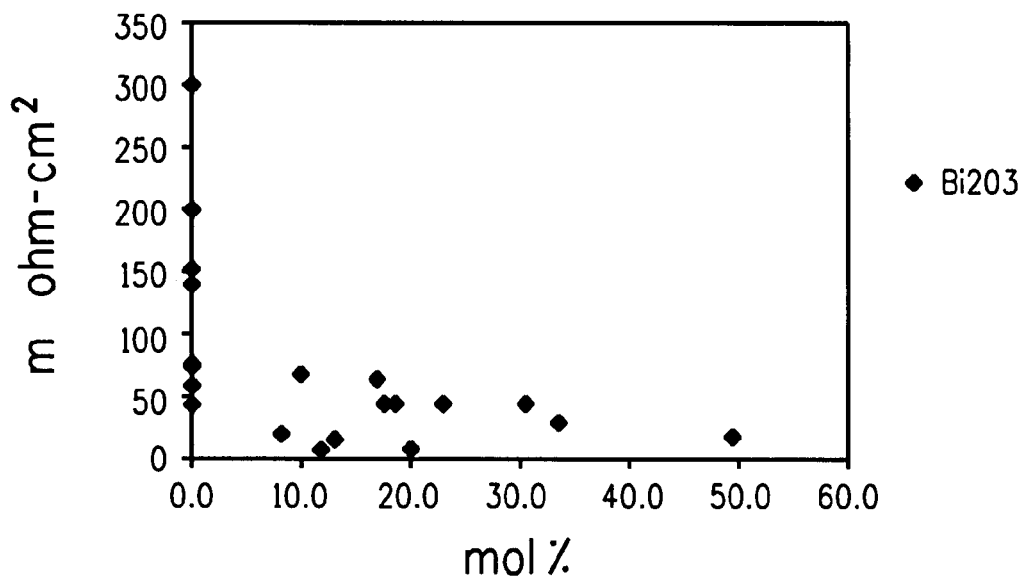
FIG. 2 is a graph showing the relationship between $Bi_2O_3$ and Rc.

Maximum set temperature: 870° C.
In-Out time: 120 sec
(C-1) Effect of $Bi_2O_3$
In order to look into the effect of $Bi_2O_3$, glass frits with a variety of the content of $Bi_2O_3$ were used to prepare a conductive paste. The Rc of formed electrode was measured in accordance with the aforementioned procedure. The data is shown at Table 1. The graph ploted with the result is shown in FIG. 2. As shown in FIG. 2, Rc performance was superior in case the content of $Bi_2O_3$ is more than 5 mol %.

TABLE 1

$Bi_2O_3$ vs Rc

| $Bi_2O_3$ | Rc |
|---|---|
| 0.0 | 300 |
| 0.0 | 200 |
| 0.0 | 76 |
| 0.0 | 300 |
| 0.0 | 78 |
| 0.0 | 60 |
| 0.0 | 140 |
| 0.0 | 150 |
| 16.8 | 66 |
| 8.0 | 20.0 |
| 30.2 | 45 |
| 49.6 | 19 |
| 0.0 | 45 |
| 22.9 | 46 |
| 13.5 | 14 |
| 17.7 | 43 |
| 18.3 | 43 |
| 34.0 | 24 |
| 9.8 | 69 |
| 19.9 | 8 |
| 12.2 | 6 |

Figure 3:
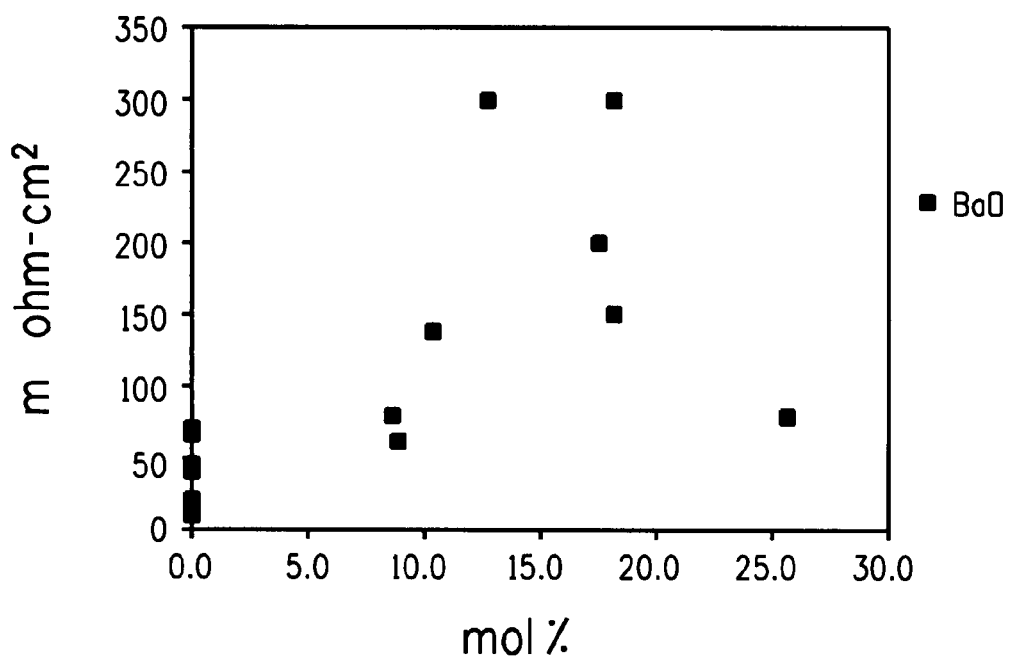
FIG. 3 is a graph showing the relationship between BaO and Rc.

(C-2) Effect of BaO
In order to look into the effect of BaO, glass frits with a variety of the content of BaO were used to prepare a conductive paste. The Rc of formed electrode was measured in accordance with the aforementioned procedure. The data is shown at Table 2. The graph ploted with the result is shown in FIG. 3. As shown in FIG. 3, Rc performance was superior in case the content of BaO is less than 5 mol %.

TABLE 2

BaO vs Rc

| BaO | Rc |
|---|---|
| 18.1 | 300 |
| 17.6 | 200 |
| 25.5 | 76 |
| 12.5 | 300 |
| 8.9 | 78 |
| 9.0 | 60 |
| 10.3 | 140 |
| 18.0 | 150 |
| 0.0 | 66 |
| 0.0 | 20.0 |
| 0.0 | 45 |
| 0.0 | 19 |
| 0.0 | 45 |
| 0.0 | 46 |
| 0.0 | 14 |
| 0.0 | 43 |
| 0.0 | 43 |
| 0.0 | 24 |
| 0.0 | 69 |
| 0.0 | 8 |
| 0.0 | 6 |

(C-3) Effect of SrO

Figure 4:
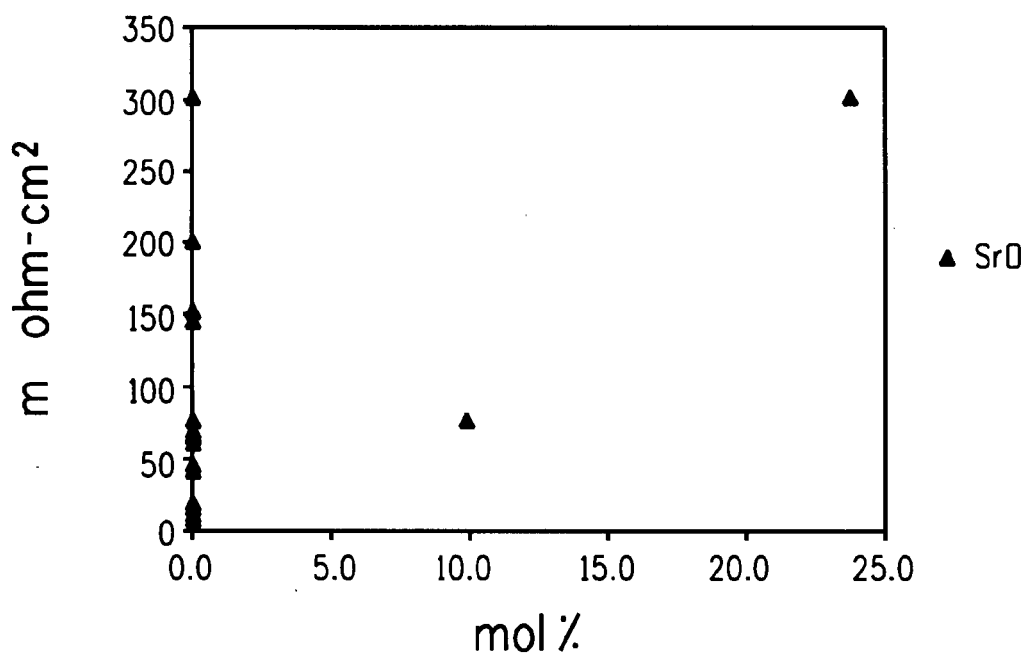
FIG. 4 is a graph showing the relationship between SrO and Rc.

In order to look into the effect of SrO, glass frits with a variety of the content of SrO were used to prepare a conductive paste. The Rc of formed electrode was measured in accordance with the aforementioned procedure. The data is shown at Table 3. The graph ploted with the result is shown in FIG. 4. As shown in FIG. 4, Rc performance was superior in case the content of SrO is less than 5 mol %.

TABLE 3

SrO vs Rc

| SrO | Rc |
|---|---|
| 0.0 | 300 |
| 0.0 | 200 |
| 9.9 | 76 |
| 23.8 | 300 |
| 0.0 | 78 |
| 0.0 | 60 |
| 0.0 | 140 |
| 0.0 | 150 |
| 0.0 | 66 |
| 0.0 | 20.0 |
| 0.0 | 45 |
| 0.0 | 19 |
| 0.0 | 45 |
| 0.0 | 46 |
| 0.0 | 14 |
| 0.0 | 43 |
| 0.0 | 43 |
| 0.0 | 24 |
| 0.0 | 69 |
| 0.0 | 8 |
| 0.0 | 6 |

(C-4) Effect of $B_2O_3$

Figure 5:
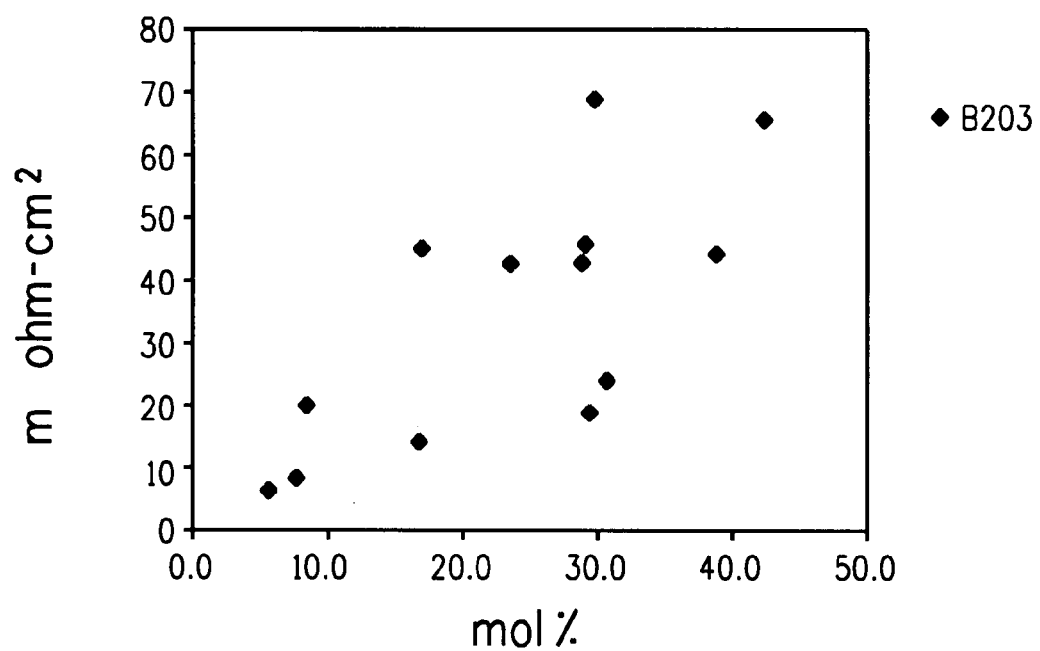
FIG. 5 is a graph showing the relationship between $B_2O_3$ and Rc.

In order to look into the effect of $B_2O_3$, glass frits with a variety of the content of $B_2O_3$ were used to prepare a conductive paste. The Rc of formed electrode was measured in accordance with the aforementioned procedure. The data is shown at Table 4. The graph ploted with the result is shown in FIG. 5. As shown in FIG. 5, Rc performance was superior in case the content of $B_2O_3$ is less than 15 mol %.

TABLE 4

$B_2O_3$ vs Rc

| $B_2O_3$ | Rc |
|---|---|
| 42.9 | 66 |
| 8.8 | 20 |
| 39.0 | 45 |
| 29.7 | 19 |
| 17.1 | 45 |
| 28.6 | 46 |
| 16.2 | 14 |
| 28.1 | 43 |
| 23.2 | 43 |
| 30.6 | 24 |
| 29.8 | 69 |
| 7.9 | 8 |
| 5.3 | 6 |

(C-5) Effect of $Al_2O_3$

Figure 6:
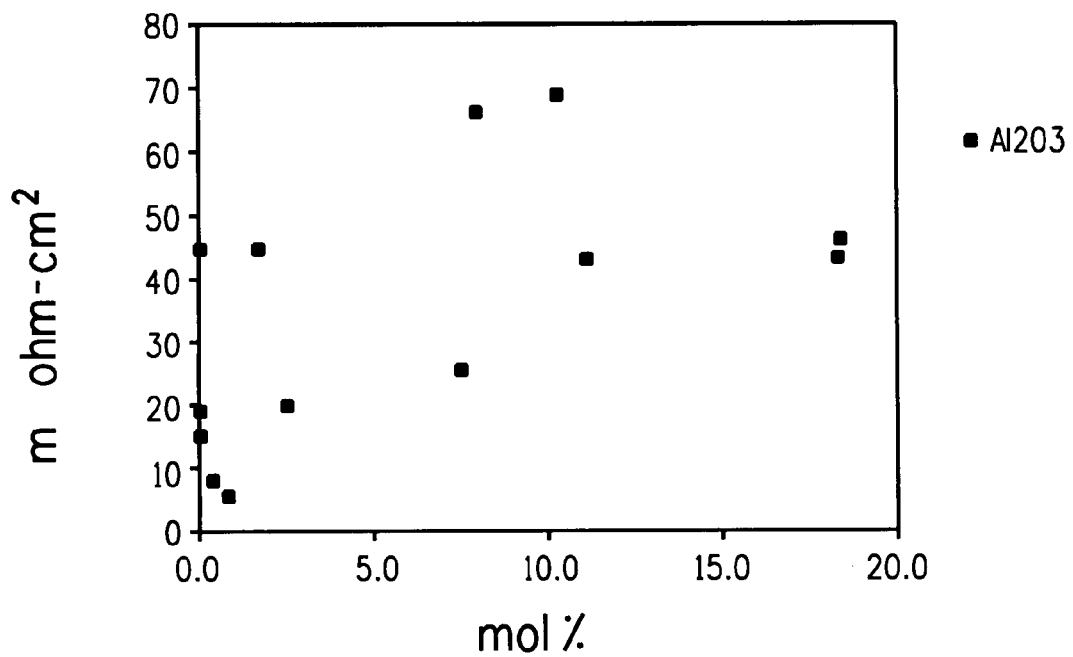
FIG. 6 is a graph showing the relationship between $Al_2O_3$ and Rc.

In order to look into the effect of $Al_2O_3$, glass frits with a variety of the content of $Al_2O_3$ were used to prepare a conductive paste. The Rc of formed electrode was measured in accordance with the aforementioned procedure. The data is shown at Table 5. The graph ploted with the result is shown in FIG. 6. As shown in FIG. 6, Rc performance was superior in case the content of $Al_2O_3$ is less than 5 mol %.

TABLE 5

$Al_2O_3$ vs Rc

| $Al_2O_3$ | Rc |
|---|---|
| 7.9 | 66 |
| 2.8 | 20 |
| 0.0 | 45 |
| 0.0 | 19 |
| 2.1 | 45 |
| 18.4 | 46 |
| 0.0 | 14 |
| 11.2 | 43 |
| 18.3 | 43 |
| 7.6 | 24 |
| 10.3 | 69 |
| 0.4 | 8 |
| 0.8 | 6 |

(II) Survey on Zn/Ag (A) Paste Preparation

Used material in the paste preparation and the content of each component are as follows.

i) Electrically Functional Silver Powders: spherical silver particle [$d_{50}$ 2.5 μm (as determined with a laser scattering-type particle size distribution measuring apparatus). The content of Ag powder was 84.0 parts by weight.

ii) Zinc oxide (ZnO) powder irregular shaped. The content of ZnO was 0.0 to 5.5 parts by weight.

iii) Glass Frit: various glass frit as shown in table 1-5 were prepared to survey the effect of each oxide contained in the glass frit. The content of glass frit was 2.5 parts by weight.

iv) Organic Medium: Ethyl cellulose resin (Aqualon, Hercules) and Terpineol. The content of organic medium was 20.2 to 23.2 parts by weight.

The content of ZnO was adjusted so as to fall in the range of 0.0 to 7.7 in terms of (ZnO/Ag)×100.

(B) Test Procedure

Solar cells were prepared in accordance with the following procedure.

First, the Si substrate was prepared. On the backside of this Si substrate, the electrically conducting paste (the silver paste) for the solder connection use was coated by screen printing and dried. Then, Aluminum paste PV333 (commercially available from E. I. du Pont de Nemours and Company) for the back electrode was coated by screen printing and dried so that it partly overlapped with the dried silver paste. The drying temperature for each paste was 120° C.

Furthermore, the coating was carried out so that after drying the film thickness of each electrode on the back, was 35 μm for the aluminum paste and 20 μm for the silver paste.

Furthermore, the paste of the present invention was coated on the light-receiving surface by screen printing and dried by use of a printing machine manufactured by Price Company. A stainless wire 250 mesh with a 8"×10" frame was used as the mesh. The test pattern was a 1.5 inch square consisting of TLM pattern which had electrode as 10 mm width and 1 mm length. The distance between electrode was 1 mm, 2 mm, 3 mm, 4 mm and 5 mm. The film thickness after firing was 13 μm.

The resulting substrate was subjected to simultaneous firing of the coated pastes in an infrared furnace with a peak temperature of about 870° C. and IN-OUT for about 2 minutes to obtain the desired solar cell.

The resistance between electrode were measured using a model R6871E multimater manufactured by ADVANTEST Co.

(C-6) Influence of ZnO/Ag

Figure 7:
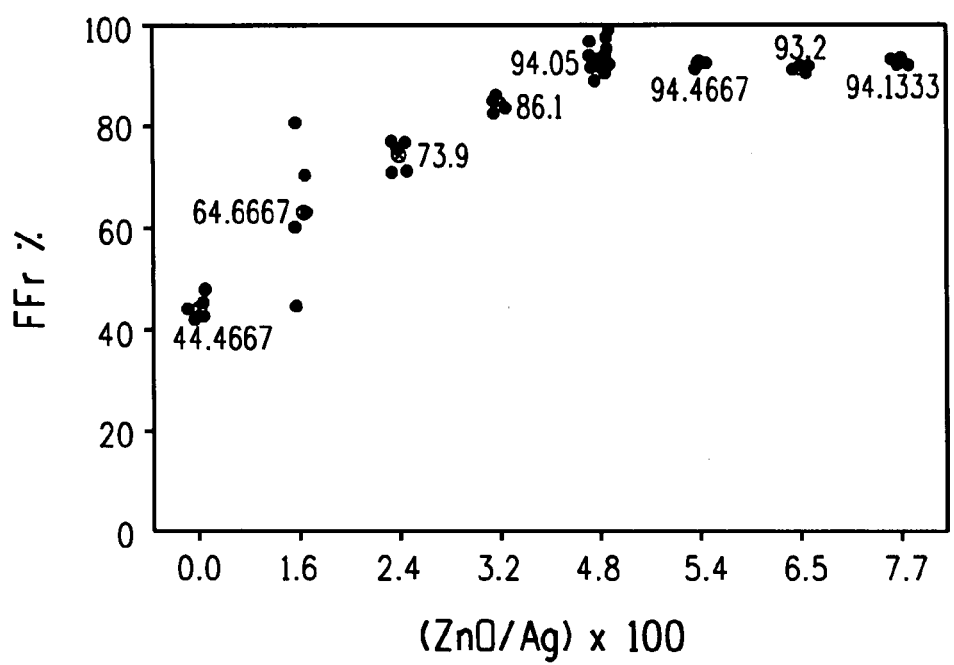
FIG. 7 is a graph showing the relationship between (ZnO/Ag)×100 and Eff.

In order to look into the relationship between electric characteristics and ZnO/Ag, pastes with a variety of the value of ZnO/Ag was prepared. The conversion efficiency (%) of formed electrode was measured in accordance with the aforementioned procedure. Five samples were prepared for each paste, and the average value for the five samples was used. The results are shown in FIG. 7. Efficiency is shown as a relative value (r %). As shown in FIG. 7, Rc performance was superior in case the content of (ZnO/Ag)×100 was more than 2.5.

What is claimed is:

1. A thick film conductive composition comprising:
    a) electrically conductive silver powder;
    b) ZnO powder;
    c) lead-free glass frits wherein based on total glass frits:
    $Bi_2O_3$>5 mol %
    $B_2O_3$<15 mol %
    BaO<5 mol %
    SrO<5 mol %
    $Al_2O_3$<5 mol %; and
    d) organic medium,
    wherein (the content of ZnO/the content of the silver powder)×100 is more than 2.5.

2. The composition of claim 1 further comprising an additional metal/metal oxide additive selected from the group consisting of (a) a metal selected from Zn, Gd, Ce, Zr, Ti, Mn, Sn, Ru, Co, Fe, Cu, and Cr; (b) an oxide of a metal selected from Gd, Ce, Zr, Ti, Mn, Sn, Ru, Co, Fe, Cu and Cr; (c) any compounds that can generate the metal oxides of (b) upon firing; and (d) mixtures thereof.

3. The thick film composition of claim 1 wherein the lead-free glass frit has the following composition based upon total glass frits
    $Bi_2O_3$ 10.0-60 mol %
    $B_2O_3$ is less than 10 mol %
    BaO is less than 2 mol %
    SrO is less than 2 mol %
    $Al_2O_3$ is less than 2 mol %.

4. The thick film composition of claim 1 wherein the average glass particle size is in the range of 1.0-4.0 μm.

5. The thick film composition of claim 1 wherein the glass frit in the composition is 0.5 to 7.0 wt % of the total composition.

6. A substrate wherein the composition of claim 1 has been deposited thereon and wherein said composition has been processed to remove said organic medium and sinter said glass frit and silver powder.

7. An electrode formed from the composition of claim 1 wherein said composition has been fired to remove the organic vehicle and sinter said glass particles.

8. A semiconductor device from the composition of claim 1.

9. A semiconductor device formed from the composition of claim 1 wherein said composition has been processed to remove said organic medium and sinter said glass frit and silver powder.

10. A method of manufacturing a semiconductor device from a structural element composed of a semiconductor having a p-n junction and an insulating film formed on a main surface of the semiconductor comprising the steps of:
    (a) applying onto said insulating film the thick film composition of claim 1; and
    (b) firing said semiconductor, insulating film and thick film composition to form an electrode.

11. The method of claim 10, wherein the insulating film is selected from the group consisting of silicon nitride film, titanium oxide film, SiNx:H film, silicon oxide film and a silicon oxide/titanium oxide film.

12. A substrate coated with a composition comprising:
    a) electrically conductive silver powder;
    b) ZnO powder;
    c) lead-free glass frits wherein, based on total glass frits:
    $Bi_2O_3$ is 10.0 to 60 mol %
    $B_2O_3$<10 mol %
    BaO<2 mol %
    SrO<2 mol %
    $Al_2O_3$<2 mol %; and
    d) organic medium,
    wherein the content of ZnO divided by the content of the silver powder×100 is more than 2.5 and wherein the composition has been processed to remove the organic medium and sinter the glass frit and silver powder.

13. A thick film conductive composition consisting of:
    a) electrically conductive silver powder;
    b) ZnO powder;
    c) lead-free glass frits wherein based on total glass frits:
    $Bi_2O_3$>5 mol %
    $B_2O_3$<15 mol %
    BaO<5 mol %
    SrO<5 mol %
    $Al_2O_3$<5 mol %; and
    d) organic medium,
    wherein (the content of ZnO/the content of the silver powder)×100 is more than 2.5 and
    further consisting of an additional metal/metal oxide additive selected from the group consisting of (a) a metal selected from Zn, Gd, Ce, Zr, Ti, Mn, Sn, Ru, Co, Fe, Cu, and Cr; (b) an oxide of a metal selected from Gd, Ce, Zr, Ti, Mn, Sn, Ru, Co, Fe, Cu and Cr; (c) any compounds that can generate the metal oxides of (b) upon firing; and (d) mixtures thereof, wherein the particle size of the additional metal additive is no more than 10 μm.

* * * * *